US011109514B1

(12) United States Patent
Liu et al.

(10) Patent No.: US 11,109,514 B1
(45) Date of Patent: Aug. 31, 2021

(54) ELECTRONIC DEVICE WITH A HEAT DISSIPATING FUNCTION AND HEAT DISSIPATING MODULE THEREOF

(71) Applicant: Moxa Inc., New Taipei (TW)

(72) Inventors: Yu-Yu Liu, New Taipei (TW); Yuan-Cheng Lee, New Taipei (TW)

(73) Assignee: Moxa Inc., New Taipei (TW)

( * ) Notice: Subject to any disclaimer, the term of this patent is extended or adjusted under 35 U.S.C. 154(b) by 0 days.

(21) Appl. No.: 16/867,573

(22) Filed: May 6, 2020

(30) Foreign Application Priority Data

Feb. 18, 2020 (TW) .................................. 109105093

(51) Int. Cl.
| | |
|---|---|
| *H05K 7/20* | (2006.01) |
| *F28F 9/26* | (2006.01) |
| *F28F 3/12* | (2006.01) |
| *H05K 5/00* | (2006.01) |

(52) U.S. Cl.
CPC ............ *H05K 7/2049* (2013.01); *F28F 3/12* (2013.01); *F28F 9/26* (2013.01); *H05K 5/006* (2013.01); *H05K 7/20336* (2013.01); *H05K 7/20418* (2013.01); *F28F 2275/12* (2013.01)

(58) Field of Classification Search
CPC .. H05K 7/2049; H05K 5/006; H05K 7/20336; H05K 7/20418; F28F 3/12; F28F 9/26; F28F 2275/12
USPC .......................................................... 361/700
See application file for complete search history.

(56) References Cited

U.S. PATENT DOCUMENTS

| | | | | |
|---|---|---|---|---|
| 4,166,665 A | * | 9/1979 | Cutchaw ............. | H01L 23/4006 257/E23.084 |
| 4,279,292 A | * | 7/1981 | Swiatosz ............... | F24F 5/0042 165/61 |
| 5,500,556 A | * | 3/1996 | Kosugi ................. | H01L 23/433 257/718 |
| 5,552,961 A | * | 9/1996 | Van Gaal ........... | H05K 7/20445 165/104.21 |
| 6,151,207 A | * | 11/2000 | Kim ...................... | G06F 1/1637 361/679.26 |
| 7,457,126 B2 | * | 11/2008 | Ahrens ................ | G02B 6/4292 257/E23.088 |

(Continued)

FOREIGN PATENT DOCUMENTS

| | | |
|---|---|---|
| CN | 106328612 A | 1/2017 |
| CN | 107396617 B | 5/2019 |

*Primary Examiner* — Anatoly Vortman
(74) *Attorney, Agent, or Firm* — Winston Hsu

(57) ABSTRACT

An electronic device includes an outer case, a heat generating component and a heat dissipating module. The heat generating component is disposed inside the outer case. The heat dissipating module is located between the outer case and the heat generating component and includes a heat conducting assembly including a first heat conducting portion fixed on the outer case and connected to the outer case and a second heat conducting portion connected to the first heat conducting portion and for abutting against the heat generating component. The second heat conducting portion is movable relative to the outer case for moving toward or away from the outer case. The heat conducting assembly is resiliently deformed to apply a force on the heat generating component in a contacting manner when the heat generating component pushes the second heat conducting portion of the heat conducting assembly to move toward the outer case.

18 Claims, 6 Drawing Sheets

(56) References Cited

U.S. PATENT DOCUMENTS

| | | | | |
|---|---|---|---|---|
| 7,898,808 B2* | 3/2011 | Joiner | ............... | H05K 7/20418 |
| | | | | 361/707 |
| 7,974,098 B2* | 7/2011 | Oki | ..................... | G02B 6/4201 |
| | | | | 361/715 |
| 8,878,060 B2* | 11/2014 | Wright | ............... | H04M 1/0202 |
| | | | | 174/50.5 |
| 9,253,871 B2* | 2/2016 | Kim | ................... | H05K 7/20672 |
| 10,342,119 B1* | 7/2019 | Mujcinovic | ............ | H05K 5/069 |
| 10,806,054 B1* | 10/2020 | Mahalingam | ...... | H05K 7/20454 |
| 2003/0161108 A1* | 8/2003 | Bright | ................. | G02B 6/4277 |
| | | | | 361/707 |
| 2004/0132331 A1* | 7/2004 | Osborn | .............. | H01L 23/4006 |
| | | | | 439/485 |

* cited by examiner

ELECTRONIC DEVICE WITH A HEAT DISSIPATING FUNCTION AND HEAT DISSIPATING MODULE THEREOF

BACKGROUND OF THE INVENTION

1. Field of the Invention

The present invention relates to an electronic device with a heat dissipating function and a heat dissipating module thereof, and more particularly, to a heat dissipating electronic device with a movable heat conducting assembly and a heat dissipating module thereof.

2. Description of the Prior Art

With advancement of technology, miniature and high performance of the electronic component have greatly increased heat generated during operation. Currently, most electronic devices use fans to dissipate heat generated by internal electronic components by forced convection. However, the fan consumes electricity and generates noise when the fan is running. In addition, the fan requires regular maintenance. Therefore, there is a need to provide an improved electronic device with no fan and a heat dissipating module thereof.

SUMMARY OF THE INVENTION

It is an objective of the present invention to provide an electronic device with a heat dissipating function and a heat dissipating module thereof for solving the aforementioned problems.

In order to achieve the aforementioned objective, the present invention discloses an electronic device with a heat dissipating function. The electronic device includes an outer case, a heat generating component and a heat dissipating module. A disposing space is formed inside the outer case. The heat generating component is disposed inside the disposing space. The heat dissipating module is disposed inside the disposing space and located between the outer case and the heat generating component. The heat dissipating module includes a heat conducting assembly. The heat conducting assembly includes a first heat conducting portion and a second heat conducting portion. The first heat conducting portion is fixed on the outer case and connected to the outer case. The second heat conducting portion is connected to the first heat conducting portion and for abutting against the heat generating component. The second heat conducting portion is movable relative to the outer case for moving toward or away from the outer case. The heat conducting assembly is resiliently deformed to apply a force on the heat generating component in a contacting manner when the heat generating component pushes the second heat conducting portion of the heat conducting assembly to move toward the outer case.

According to an embodiment of the present invention, the heat conducting assembly includes at least one first heat conducting component and at least one second heat conducting component. A first portion of the at least one first heat conducting component away from the heat generating component is fixed on the outer case. A second portion of the at least one first heat conducting component adjacent to the heat generating component is movable relative to the outer case for moving toward or away from the outer case. The at least one second heat conducting component is connected to the second portion of the at least one first heat conducting component and for abutting against the heat generating component to conduct heat generated by the heat generating component to the at least one first heat conducting component. The first portion of the at least one first heat conducting component defines the first heat conducting portion of the heat conducting assembly, and a combination of the second portion of the at least one first heat conducting component and the at least one second heat conducting component defines the second heat conducting portion of the heat conducting assembly.

According to an embodiment of the present invention, the heat dissipating module further includes at least one resilient component disposed between the at least one second heat conducting component and the outer case.

According to an embodiment of the present invention, when the heat generating component pushes the at least one second heat conducting component to drive the second portion of the at least one first heat conducting component to move toward the outer case, the at least one first heat conducting component and the at least one resilient component are resiliently deformed to apply the force on the heat generating component.

According to an embodiment of the present invention, when the heat generating component pushes the at least one second heat conducting component to drive the second portion of the at least one first heat conducting component to move toward the outer case, the at least one first heat conducting component is resiliently deformed to apply the force on the heat generating component.

According to an embodiment of the present invention, the heat dissipating module further includes at least one first accommodating slot structure and at least one second accommodating slot structure. The at least one first accommodating slot structure and the at least one second accommodating slot structure are formed on the outer case. The first portion of the at least one first heat conducting component is accommodated inside the at least one first accommodating slot structure. The at least one second heat conducting component and the second portion of the at least one first heat conducting component are accommodated inside the at least one second accommodating slot structure, and a depth of the at least one second accommodating slot structure is greater than a depth of the at least one first accommodating slot structure.

According to an embodiment of the present invention, the at least one first heat conducting component is a heat conducting pipe, and the at least one second heat conducting component is a heat conducting block.

According to an embodiment of the present invention, the heat dissipating module further includes at least one resilient component disposed between the second heat conducting portion of the heat conducting assembly and the outer case.

According to an embodiment of the present invention, the heat dissipating module further includes a first accommodating slot structure and a second accommodating slot structure. The first accommodating slot structure and the second accommodating slot structure are formed on the outer case. The first heat conducting portion of the heat conducting assembly is accommodated inside the first accommodating slot structure. The second heat conducting portion of the heat conducting assembly is accommodated inside the second accommodating slot structure, and a depth of the second accommodating slot structure is greater than a depth of the first accommodating slot structure.

According to an embodiment of the present invention, the electronic device further includes a circuit board. The heat generating component is installed on the circuit board, and the circuit board is fastened onto the outer case by engagement of at least one screw and at least one screw boss.

According to an embodiment of the present invention, the electronic device further includes a plurality of heat dissipating fins disposed on a side of the outer case away from the heat dissipating module.

In order to achieve the aforementioned objective, the present invention further discloses a heat dissipating module located between an outer case and a heat generating component. The heat dissipating module includes a heat conducting assembly. The heat conducting assembly includes a first heat conducting portion and a second heat conducting portion. The first heat conducting portion is fixed on the outer case and connected to the outer case. The second heat conducting portion is connected to the first heat conducting portion and for abutting against the heat generating component. The second heat conducting portion is movable relative to the outer case for moving toward or away from the outer case. The heat conducting assembly is resiliently deformed to apply a force on the heat generating component in a contacting manner when the heat generating component pushes the second heat conducting portion of the heat conducting assembly to move toward the outer case.

In summary, in the present invention, the heat generating component can push the second heat conducting portion of the heat conducting assembly to move toward the outer case, so that the heat conducting assembly is resiliently deformed to apply the force on the heat generating component in the contacting manner, which makes the heat generating component and the heat conducting assembly attached to each other firmly to effectively conduct the heat generated by the heat generating component to the outer case through the second heat conducting portion and the first conducting portion. Therefore, the present invention has an enhanced heat dissipating efficiency. Furthermore, the present invention does not require a fan to dissipate the heat generated by the heat generating component. Therefore, the present invention has advantages of low power consumption, low noise and low maintenance cost. Besides, the present invention also can solve a problem of tolerance accumulation in assembly of the electronic device and simplify an assembly process of the electronic device.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the preferred embodiments, reference is made to the accompanying drawings which form a part hereof, and in which is shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. Accordingly, the drawings and descriptions will be regarded as illustrative in nature and not as restrictive.

Figure 1:
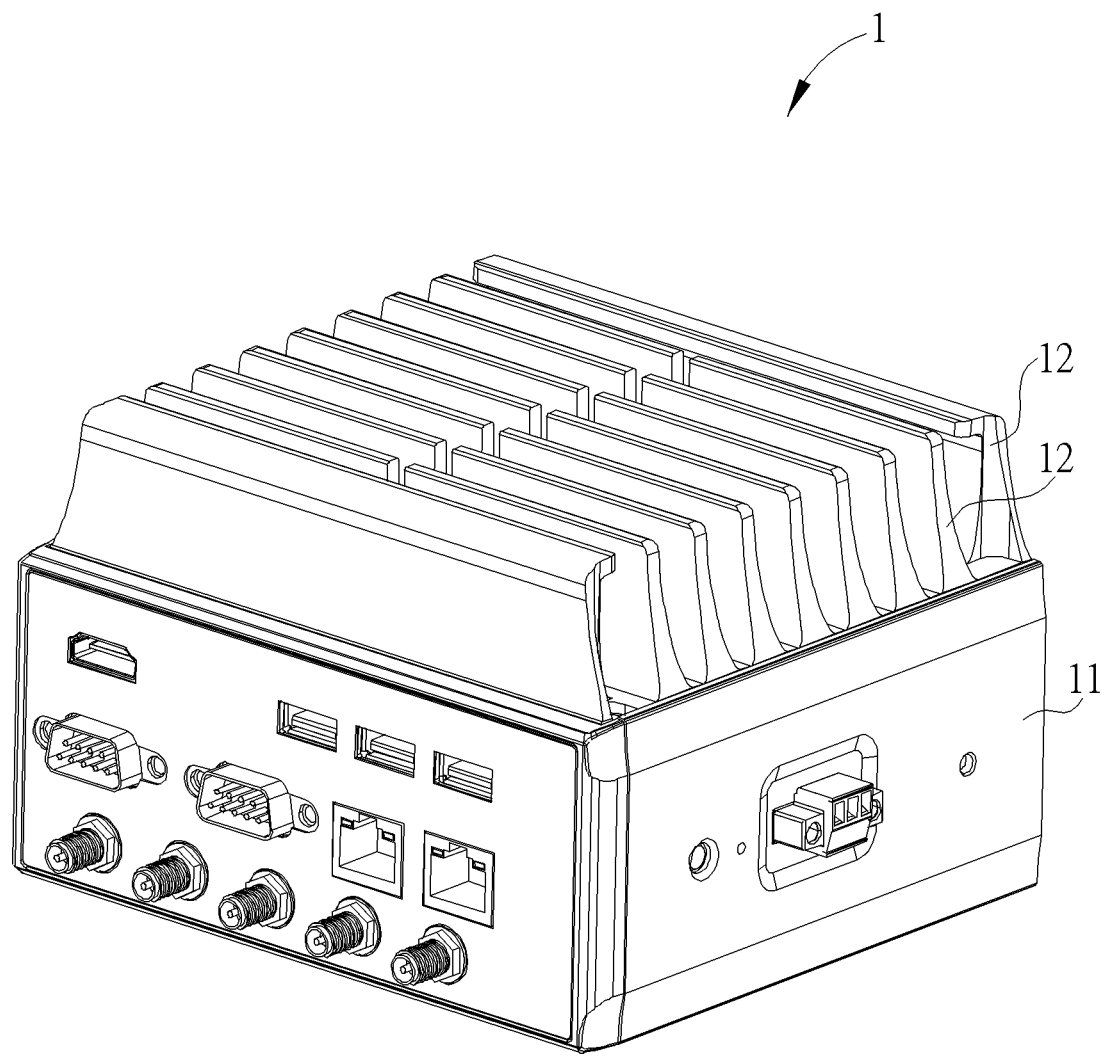
FIG. 1 is a schematic diagram of an electronic device according to an embodiment of the present invention.
Figure 2:
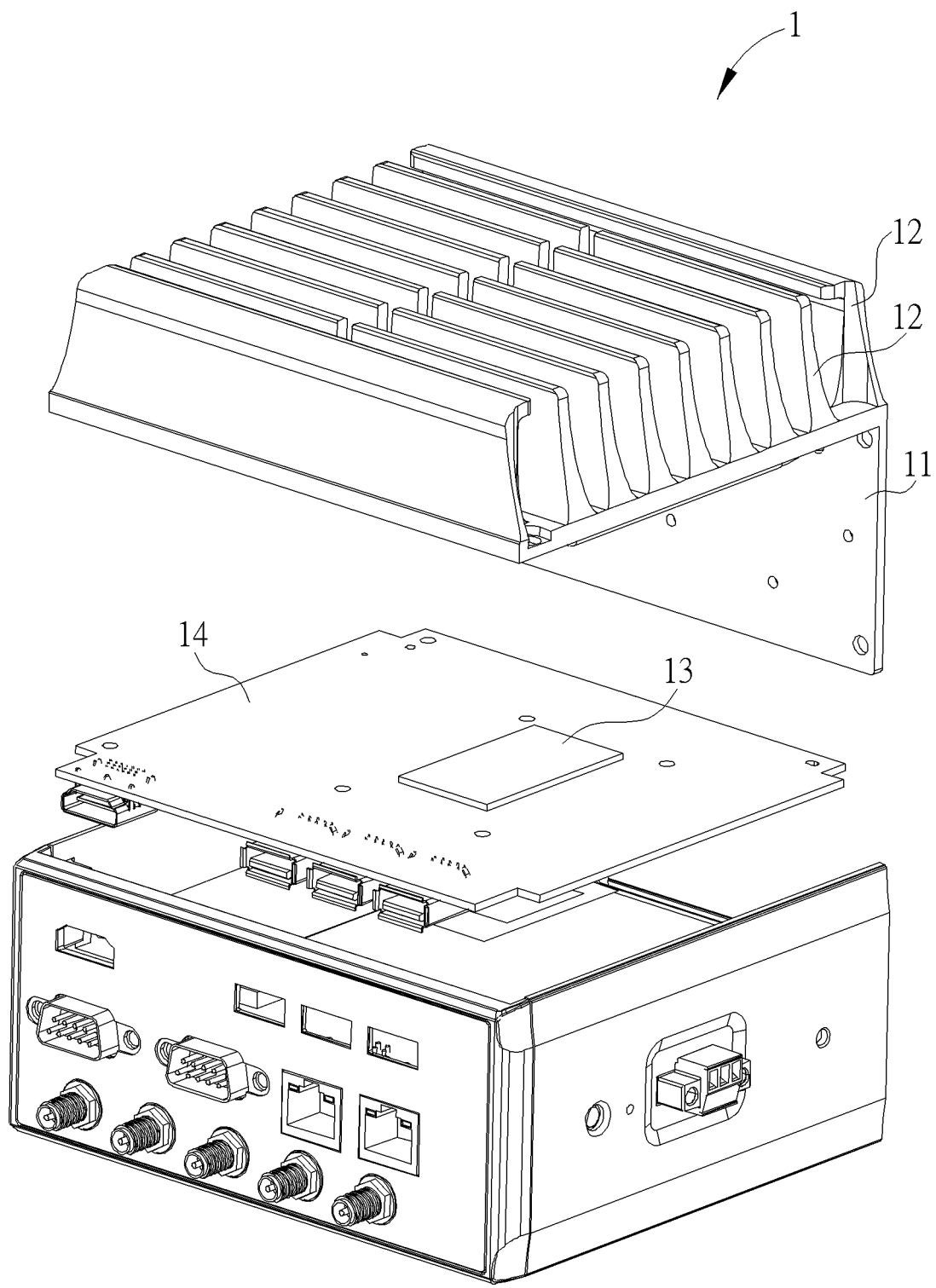
FIG. 2 and FIG. 3 are exploded diagrams of the electronic device according to the embodiment of the present invention.
Figure 3:
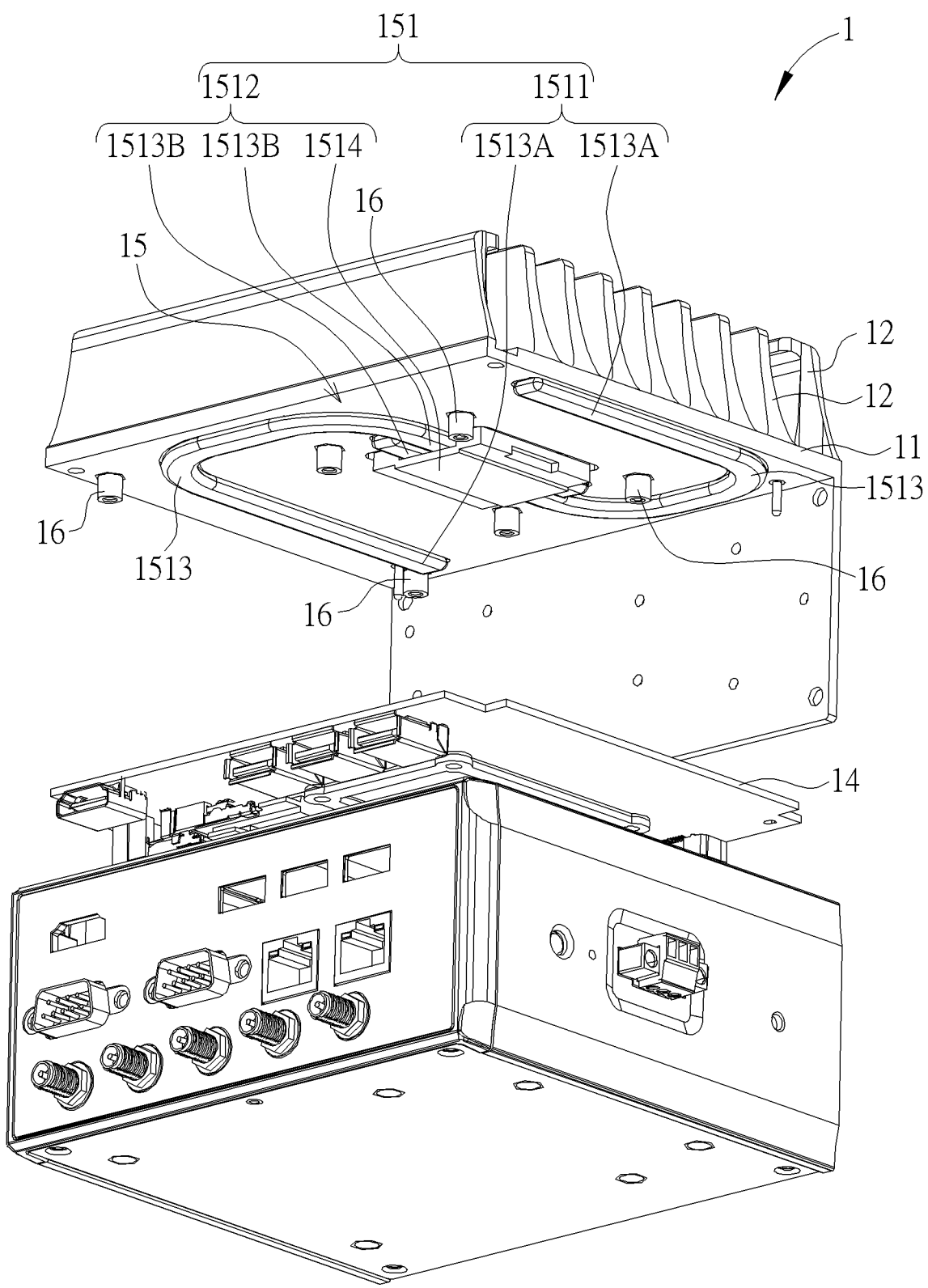
Figure 4:
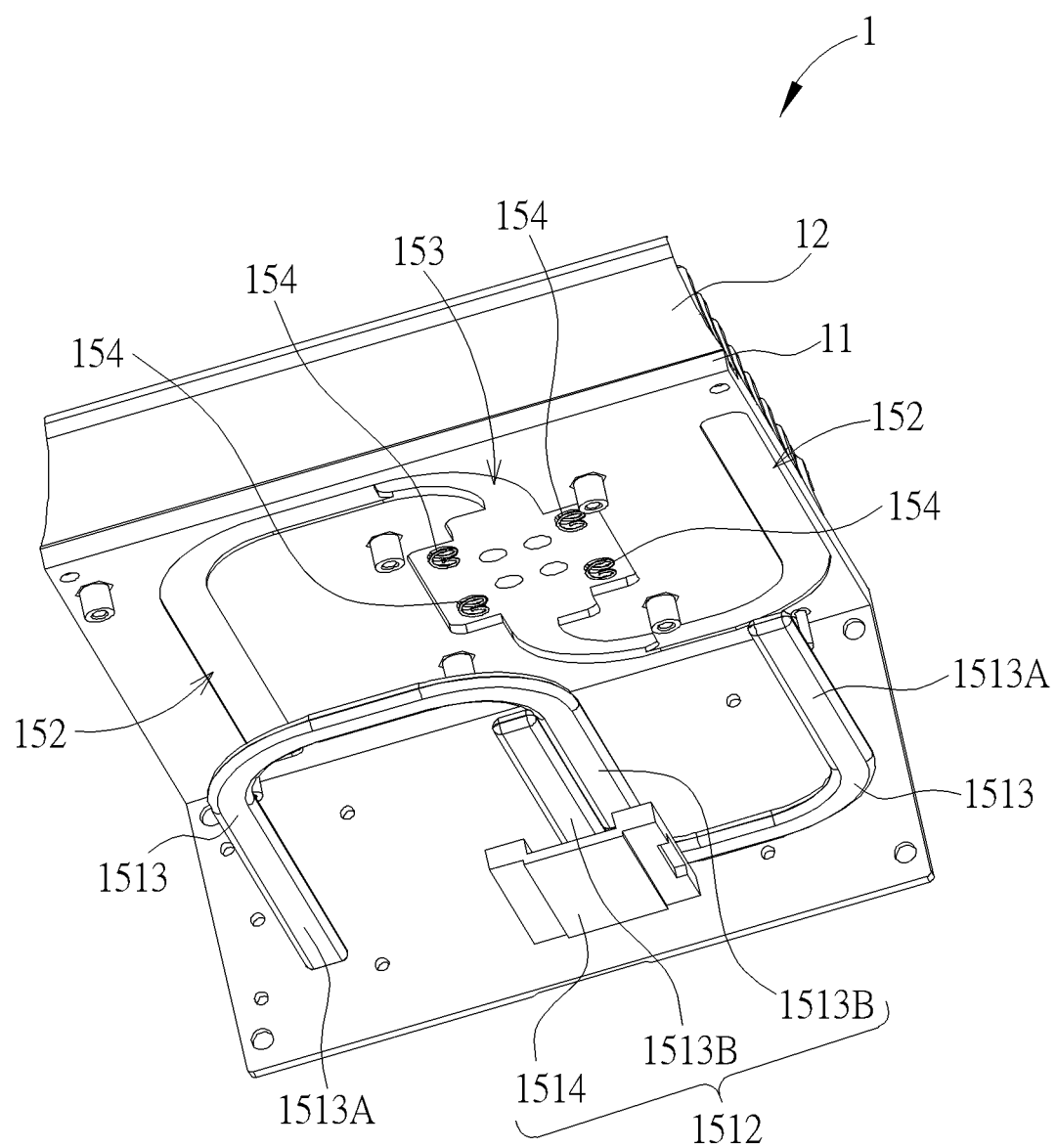
FIG. 4 is a partial exploded diagram of the electronic device according to the embodiment of the present invention.
Figure 5:
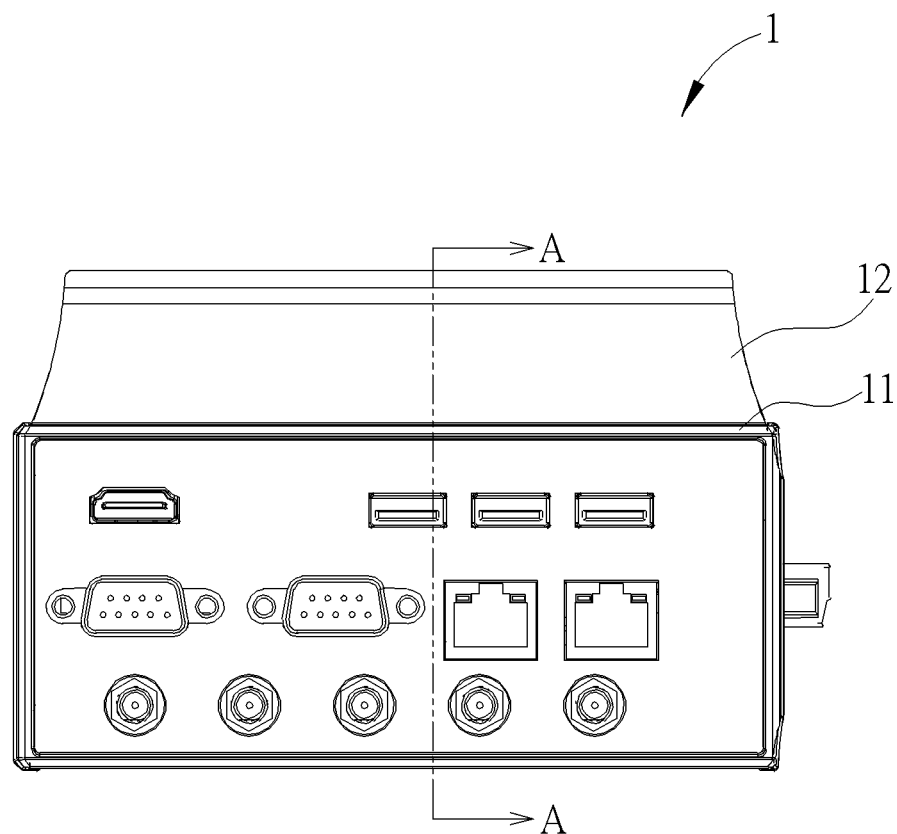
FIG. 5 is a front view diagram of the electronic device according to the embodiment of the present invention.
Figure 6:
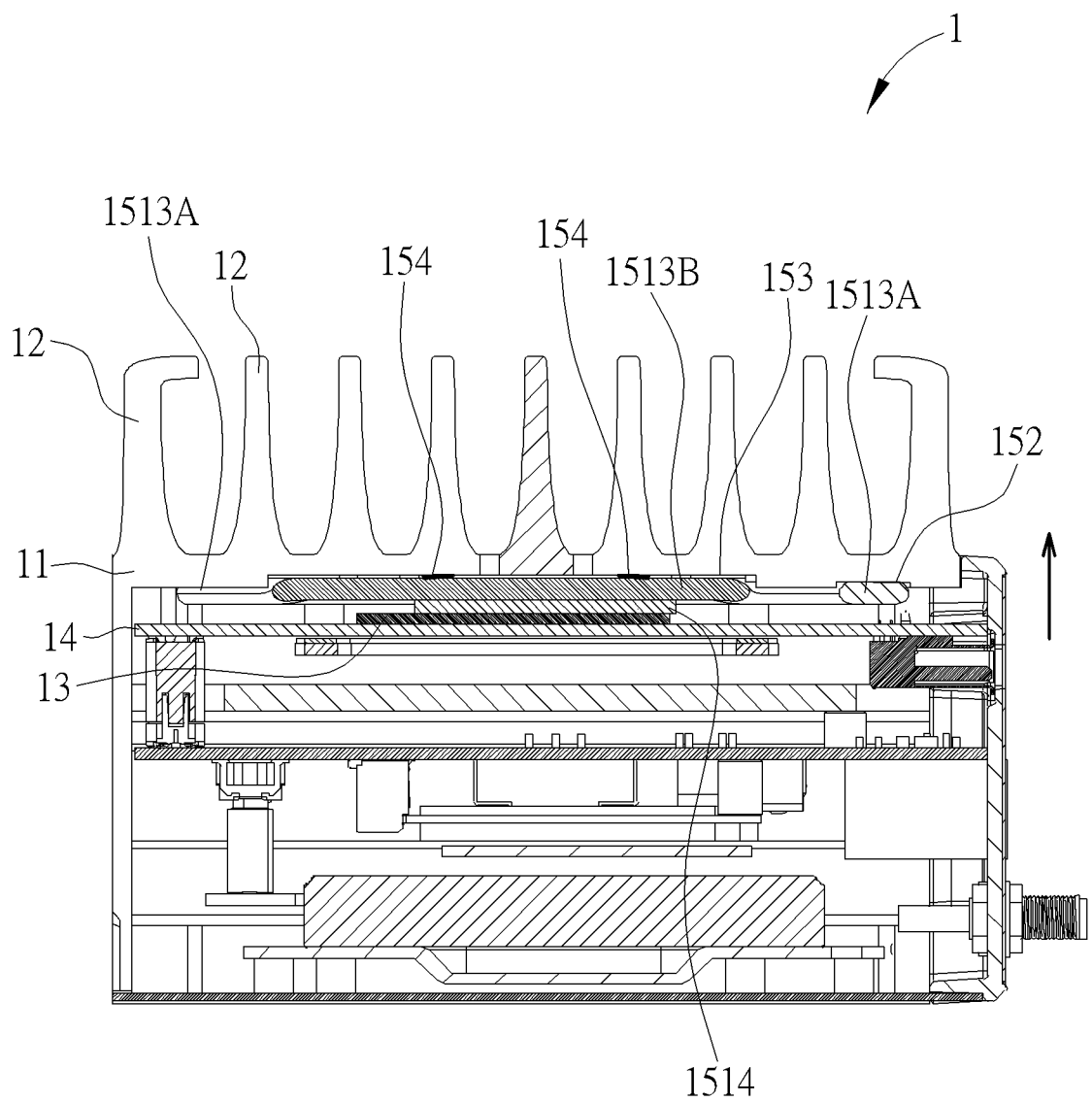
FIG. 6 is a sectional diagram of the electronic device along an A-A line shown in FIG. 5 according to the embodiment of the present invention.

Please refer to FIG. 1 to FIG. 6. FIG. 1 is a schematic diagram of an electronic device 1 according to an embodiment of the present invention. FIG. 2 and FIG. 3 are exploded diagrams of the electronic device 1 according to the embodiment of the present invention. FIG. 4 is a partial exploded diagram of the electronic device 1 according to the embodiment of the present invention. FIG. 5 is a front view diagram of the electronic device 1 according to the embodiment of the present invention. FIG. 6 is a sectional diagram of the electronic device 1 along an A-A line shown in FIG. 5 according to the embodiment of the present invention. As shown in FIG. 1 to FIG. 6, the electronic device 1 includes an outer case 11, a plurality of heat dissipating fins 12, a heat generating component 13, a circuit board 14 and a heat dissipating module 15. A disposing space 111 is formed inside the outer case 11. The heat generating component 13 is disposed inside the disposing space 111 and installed on the circuit board 14. Preferably, in this embodiment, the heat generating component 13 can be a processor adhered with a thermally conductive silicone pad. The circuit board 14 and the outer case 11 can be fastened with each other by engagement of at least one screw, which is not shown in the figures, and at least one screw boss 16. The heat dissipating module 15 is disposed inside the disposing space 111 and located between the outer case 11 and the heat generating component 13 for conducting heat generated by the heat generating component 13 to the outer case 11 during operation of the heat generating component 13. The plurality of heat dissipating fins 12 are disposed on an outer side of the outer case 11 away from the heat dissipating module 15 for increasing a heat dissipating area of the outer case 11 to enhance a heat dissipating efficiency.

However, the present invention is not limited to this embodiment. For example, in another embodiment, the heat dissipating fin can be omitted. Alternatively, in another embodiment, the circuit board can be fastened onto a structure other than the outer case. Alternatively, in another embodiment, the heat generating component can be an electronic component disposed on a structure other than the processor disposed on the circuit board.

The heat dissipating module 15 includes a heat conducting assembly 151. The heat conducting assembly 151 includes a first heat conducting portion 1511 and a second heat conducting portion 1512. The first heat conducting portion 1511 is fixed on the outer case 11 and connected to the outer case 11. The second heat conducting portion 1512 is connected to the first heat conducting portion 1511 and for abutting against the heat generating component 13. The second heat conducting portion 1512 is movable relative to the outer case 11 for moving toward or away from the outer case 11. During assembly of the electronic device 1, the heat generating component 13 can push the second heat conducting portion 1512 to move toward the outer case 11, so that the heat conducting assembly 151 is resiliently deformed to apply a force on the heat generating component 13 in a contacting manner, which makes the heat conducting assembly 151 and the heat generating component 13 attached to each other more firmly to enhance the heat dissipating efficiency.

Specifically, the heat conducting assembly 151 includes two first heat conducting components 1513 and a second heat conducting component 1514. Preferably, in this embodiment, each first heat conducting component 1513 can be a heat conducting pipe, and the second heat conducting component 1514 can be a heat conducting block. A first portion 1513A of each first heat conducting component 1513 away from the heat generating component 13 is fixed on the outer case 11. A second portion 1513B of the first heat conducting component 1513 adjacent to the heat generating component 13 is movable relative to the outer case 11 for moving toward or away from the outer case 11. The second heat conducting component 1514 is connected to the second portions 1513B of the two first heat conducting components 1513. The second heat conducting component 1514 is for abutting against the heat generating component 13 and the two first heat conducting components 1513 to conduct the heat generated by the heat generating component 13 to the two first heat conducting components 1513. In other words, the first portions 1513A of the two first heat conducting components 1513 define the first heat conducting portion 1511 of the heat conducting assembly 151, and a combination of the second portions 1513B of the two first heat conducting components 1513 and the second heat conducting component 1514 defines the second heat conducting portion 1512 of the heat conducting assembly 151. Specifically, in this embodiment, the first heat conducting portion 1511 can be a fixing section of the heat conducting assembly 151 fixed on the outer case 11, and the second heat conducting portion 1512 can be a free section of the heat conducting assembly 151 movable relative to the outer case.

However, the present invention is not limited to this embodiment. For example, in another embodiment, the heat conducting assembly can include two first heat conducting components and two second heat conducting components. The first portion and the second portion of each first heat conducting component respectively abut against the outer case and the corresponding second heat conducting component. The two second heat conducting components are for abutting against the heat generating component. In other words, in this embodiment, the first portions of the two first heat conducting components define the first heat conducting portion of the heat conducting assembly, and a combination of the second portions of the two first heat conducting components and the two second heat conducting components define the second heat conducting portion of the heat conducting assembly. Alternatively, in another embodiment, the heat conducting assembly can include one first heat conducting component only. In other words, in this embodiment, the first portion of the first heat conducting component abutting against the outer case defines the first heat conducting portion of the heat conducting assembly, and the second portion of the first heat conducting component abutting against the heat generating component defines the second heat conducting portion of the heat conducting assembly.

Besides, the heat dissipating module 15 further includes two first accommodating slot structures 152 and a second accommodating slot structure 153 formed on the outer case 11. Preferably, in this embodiment, a shape of each first accommodating slot structure 152 can be in accordance with a shape of the first portion 1513A of the corresponding first heat conducting component 1513, i.e., a combination of the shape of the two first accommodating slot structures 152 can be in accordance with a shape of the first heat conducting portion 1511 of the heat conducting assembly 151. A shape of the second accommodating slot structure 153 can be in accordance with a shape of the combination of the second portions 1513B of the two first heat conducting components 1513 and the second heat conducting component 1514, i.e., the shape of the second accommodating slot structure 153 can be in accordance with a shape of the second heat conducting portion 1512 of the heat conducting assembly 151. The first portion 1513A of each first heat conducting component 1513 is accommodated inside the corresponding first accommodating slot structure 152, i.e., the first heat conducting portion 1511 of the heat conducting assembly 151 is accommodated inside the two first accommodating slot structures 152. The combination of the second portions 1513B of the two first heat conducting components 1513 and the second heat conducting component 1514 is accommodated inside the second accommodating slot structure 153, i.e., the second heat conducting portion 1512 of the heat conducting assembly 151 is accommodated inside the second accommodating slot structure 153.

It should be noticed that a depth of the second accommodating slot structure 153 is greater than a depth of the first accommodating slot structure 152. The first portion 1513A of each first heat conducting component 1513 abuts against and is fixed on a wall of the corresponding first accommodating slot structure 152. The combination of the second heat conducting component 1514 and the second portions 1513B of the two first heat conducting components 1513 does not abut against and is separated from a wall of second accommodating slot structure 153. Therefore, when the heat generating component 13 pushes the second heat conducting component 1514, the combination of the second portions 1513B of the two first heat conducting components 1513 and the second heat conducting component 1514 can move toward the outer case 11 by deformation of the second portions 1513B of the two first heat conducting components 1513 with no interference from the wall of the second accommodating slot structure 153.

However, the present invention is not limited to this embodiment. Any configuration that allows the second heat conducting portion of the heat conducting assembly to move relative to the outer case for applying the force on the heat generating component is included within the scope of the present invention. For example, in another embodiment, the depth of the first accommodating slot structure can be equal to the depth of the second accommodating slot structure, and there can be a soldering layer with a good heat conductivity filled between each first accommodating slot structure and the first portion of the corresponding first heat conducting component, so that the combination of the second heat conducting component and the second portions of the two first heat conducting component can be separated from the wall of the second accommodating slot structure for allowing movability of the combination of the second heat conducting component and the second portions of the two first heat conducting component relative to the outer case when the first portion of each first heat conducting component is fixed in the corresponding first accommodating slot structure by the corresponding soldering layer. Alternatively, in another embodiment, the depth of the first accommodating slot structure can be equal to the depth of the second accommodating slot structure, a thickness of the first portion of each first heat conducting component can be greater than an overall thickness of the combination of the second portions of the two first heat conducting components and the second heat conducting component, so that the combination of the second heat conducting component and the second portions of the two first heat conducting component can be separated from the wall of the second accommodating slot structure for allowing the movability of the second heat conducting component and the second portions of the two first heat conducting component relative to the outer case when the first portion of each first heat conducting component is fixed in the corresponding first accommodating slot structure.

In addition, the heat dissipating module 15 further includes four resilient components 154. The four resilient components 154 are disposed between the second heat conducting component 1514 and the outer case 11. Each resilient component 154 is for being resiliently compressed to apply a resilient force on the second heat conducting component 1514 for increasing a contacting normal force of the second heat conducting component applied on the heat generating component 13 when the combination of the second portions 1513B of the two first heat conducting components 1513 and the second heat conducting component 1514 moves toward the outer case 11. However, the present invention is not limited to this embodiment. For example, in another embodiment, the resilient component can be omitted. In other words, in this embodiment, the contacting normal force of the second heat conducting component applied on the heat generating component can be generated by the deformation of the second portions of the two first heat conducting component only.

Preferably, in this embodiment, each resilient component 154 can be a compressed spring. However, the present invention is not limited to this embodiment. For example, in another embodiment, the resilient component can be a torsional spring, a flat spring, a resilient arm, a resilient plate or a structure made of resilient material, such as a silicone rubber.

During the assembly of the electronic device 1, e.g., during a process that the circuit board 14 is fastened onto the outer base 11 by the engagement of the screw and the screw boss 16, the heat generating component 13 can push the second heat conducting component 1514, so that the combination of the second portions 1513B of the two first heat conducting components 1513 and the second heat conducting component 1514 moves toward the outer case 11 along an arrow direction as shown in FIG. 6 to resiliently deform the second portion 1513B of the two first heat conducting components 1513 and the four resilient components 154, so as to increase the contacting normal force of the second heat conducting component 1514 applied on the heat generating component 13, which makes the heat conducting assembly 151 and the heat generating component 13 attached to each other more firmly to enhance the heat dissipating efficiency. Besides, the configuration that allows the second heat conducting portion 1512 to move relative to the outer case 11 can solve a problem of tolerance accumulation in the assembly of the electronic device 1 and simplify an assembly process of the electronic device 1.

In contrast to the prior art, in the present invention, the heat generating component can push the second heat conducting portion of the heat conducting assembly to move toward the outer case, so that the heat conducting assembly is resiliently deformed to apply the force on the heat generating component in the contacting manner, which makes the heat generating component and the heat conducting assembly attached to each other firmly to effectively conduct the heat generated by the heat generating component to the outer case through the second heat conducting portion and the first conducting portion. Therefore, the present invention has the enhanced heat dissipating efficiency. Furthermore, the present invention does not require a fan to dissipate the heat generated by the heat generating component. Therefore, the present invention has advantages of low power consumption, low noise and low maintenance cost. Besides, the present invention also can solve the problem of tolerance accumulation in the assembly of the electronic device and simplify the assembly process of the electronic device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic device with a heat dissipating function, the electronic device comprising:
    an outer case, a disposing space being formed inside the outer case;
    a heat generating component disposed inside the disposing space; and
    a heat dissipating module disposed inside the disposing space and located between the outer case and the heat generating component, the heat dissipating module comprising:
        a heat conducting assembly comprising:
            at least one first heat conducting component, a first portion of the at least one first heat conducting component away from the heat generating component being fixed on the outer case, a second portion of the at least one first heat conducting component adjacent to the heat generating component being movable relative to the outer case for moving toward or away from the outer case; and
            at least one second heat conducting component connected to the second portion of the at least one first heat conducting component and for abutting against the heat generating component to conduct heat generated by the heat generating component to the at least one first heat conducting component;
    wherein the first portion of the at least one first heat conducting component defines a first heat conducting portion of the heat conducting assembly, a combination of the second portion of the at least one first heat conducting component and the at least one second heat conducting component defines a second heat conducting portion of the heat conducting assembly, the first heat conducting portion is fixed on the outer case and connected to the outer case, the second heat conducting portion is connected to the first heat conducting portion and for abutting against the heat generating component, the second heat conducting portion is movable relative to the outer case for moving toward or away from the outer case, and the heat conducting assembly is resiliently deformed to apply a force on the heat generating component in a contacting manner when the heat generating component pushes the second heat conducting portion of the heat conducting assembly to move toward the outer case.

2. The electronic device of claim 1, wherein the heat dissipating module further comprises at least one resilient component disposed between the at least one second heat conducting component and the outer case.

3. The electronic device of claim 2, wherein when the heat generating component pushes the at least one second heat conducting component to drive the second portion of the at least one first heat conducting component to move toward the outer case, the at least one first heat conducting component and the at least one resilient component are resiliently deformed to apply the force on the heat generating component.

4. The electronic device of claim 1, wherein when the heat generating component pushes the at least one second heat conducting component to drive the second portion of the at least one first heat conducting component to move toward the outer case, the at least one first heat conducting component is resiliently deformed to apply the force on the heat generating component.

5. The electronic device of claim 1, wherein the heat dissipating module further comprises at least one first accommodating slot structure and at least one second accommodating slot structure, the at least one first accommodating slot structure and the at least one second accommodating slot structure are formed on the outer case, the first portion of the at least one first heat conducting component is accommodated inside the at least one first accommodating slot structure, the at least one second heat conducting component and the second portion of the at least one first heat conducting component are accommodated inside the at least one second accommodating slot structure, and a depth of the at least one second accommodating slot structure is greater than a depth of the at least one first accommodating slot structure.

6. The electronic device of claim 5, wherein the at least one first heat conducting component is a heat conducting pipe, and the at least one second heat conducting component is a heat conducting block.

7. The electronic device of claim 1, wherein the heat dissipating module further comprises at least one resilient component disposed between the second heat conducting portion of the heat conducting assembly and the outer case.

8. The electronic device of claim 1, wherein the heat dissipating module further comprises a first accommodating slot structure and a second accommodating slot structure, the first accommodating slot structure and the second accommodating slot structure are formed on the outer case, the first heat conducting portion of the heat conducting assembly is accommodated inside the first accommodating slot structure, the second heat conducting portion of the heat conducting assembly is accommodated inside the second accommodating slot structure, and a depth of the second accommodating slot structure is greater than a depth of the first accommodating slot structure.

9. The electronic device of claim 1, further comprising a circuit board, the heat generating component being installed on the circuit board, and the circuit board being fastened onto the outer case by engagement of at least one screw and at least one screw boss.

10. The electronic device of claim 1, further comprising a plurality of heat dissipating fins disposed on a side of the outer case away from the heat dissipating module.

11. A heat dissipating module located between an outer case and a heat generating component, the heat dissipating module comprising:
  a heat conducting assembly comprising:
    at least one first heat conducting component, a first portion of the at least one first heat conducting component away from the heat generating component being fixed on the outer case, a second portion of the at least one first heat conducting component adjacent to the heat generating component being movable relative to the outer case for moving toward or away from the outer case; and
    at least one second heat conducting component connected to the second portion of the at least one first heat conducting component and for abutting against the heat generating component to conduct heat generated by the heat generating component to the at least one first heat conducting component;
  wherein the first portion of the at least one first heat conducting component defines a first heat conducting portion of the heat conducting assembly, a combination of the second portion of the at least one first heat conducting component and the at least one second heat conducting component defines a second heat conducting portion of the heat conducting assembly, the first heat conducting portion is fixed on the outer case and connected to the outer case, the second heat conducting portion is connected to the first heat conducting portion and for abutting against the heat generating component, the second heat conducting portion is movable relative to the outer case for moving toward or away from the outer case, and the heat conducting assembly is resiliently deformed to apply a force on the heat generating component in a contacting manner when the heat generating component pushes the second heat conducting portion of the heat conducting assembly to move toward the outer case.

12. The heat dissipating module of claim 11, further comprising at least one resilient component disposed between the at least one second heat conducting component and the outer case.

13. The heat dissipating module of claim 12, wherein when the heat generating component pushes the at least one second heat conducting component to drive the second portion of the at least one first heat conducting component to move toward the outer case, the at least one first heat conducting component and the at least one resilient component are resiliently deformed to apply the force on the heat generating component.

14. The heat dissipating module of claim 11, wherein when the heat generating component pushes the at least one second heat conducting component to drive the second portion of the at least one first heat conducting component to move toward the outer case, the at least one first heat conducting component is resiliently deformed to apply the force on the heat generating component.

15. The heat dissipating module of claim 11, wherein the heat dissipating module further comprises at least one first accommodating slot structure and at least one second accommodating slot structure, the at least one first accommodating slot structure and the at least one second accommodating slot structure are formed on the outer case, the first portion of the at least one first heat conducting component is accommodated inside the at least one first accommodating slot structure, the at least one second heat conducting component and the second portion of the at least one first heat conducting component are accommodated inside the at least one second accommodating slot structure, and a depth of the at least one second accommodating slot structure is greater than a depth of the at least one first accommodating slot structure.

16. The heat dissipating module of claim 15, wherein the at least one first heat conducting component is a heat conducting pipe, and the at least one second heat conducting component is a heat conducting block.

17. The heat dissipating module of claim 11, further comprising at least one resilient component disposed between the second heat conducting portion of the heat conducting assembly and the outer case.

18. The electronic device of claim 11, wherein the heat dissipating module further comprises a first accommodating slot structure and a second accommodating slot structure, the first accommodating slot structure and the second accommodating slot structure are formed on the outer case, the first heat conducting portion of the heat conducting assembly is accommodated inside the first accommodating slot structure, the second heat conducting portion of the heat conducting assembly is accommodated inside the second accommodating slot structure, and a depth of the second accommodating slot structure is greater than a depth of the first accommodating slot structure.

* * * * *